United States Patent
Sander et al.

(10) Patent No.: US 7,439,579 B2
(45) Date of Patent: Oct. 21, 2008

(54) POWER SEMICONDUCTOR WITH FUNCTIONAL ELEMENT GUIDE STRUCTURE

(75) Inventors: Rainald Sander, Munich (DE); Markus Zundel, Egmating (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/137,942

(22) Filed: May 26, 2005

(65) Prior Publication Data

US 2005/0275013 A1 Dec. 15, 2005

(30) Foreign Application Priority Data

May 28, 2004 (DE) .................. 10 2004 026 233

(51) Int. Cl.
*H01L 29/94* (2006.01)

(52) U.S. Cl. ............ 257/330; 257/E29.2; 257/E29.201; 257/E29.257; 257/E29.26; 257/E21.655; 257/E21.585

(58) Field of Classification Search ......... 257/327–334, 257/E29.2, E29.201, E29.257, E29.26
See application file for complete search history.

(56) References Cited

U.S. PATENT DOCUMENTS

| | | | |
|---|---|---|---|
| 5,691,555 A | 11/1997 | Zambrano et al. | |
| 5,821,580 A | 10/1998 | Kuwahara | |
| 6,049,408 A * | 4/2000 | Tada | 359/204 |
| 6,144,085 A | 11/2000 | Barker | |
| 6,180,966 B1 | 1/2001 | Kohno et al. | |
| 6,262,453 B1 * | 7/2001 | Hshieh | 257/341 |
| 6,621,121 B2 * | 9/2003 | Baliga | 257/330 |
| 6,806,533 B2 | 10/2004 | Henninger et al. | |
| 6,885,062 B2 | 4/2005 | Zundel et al. | |
| 2002/0056872 A1 * | 5/2002 | Baliga | 257/330 |
| 2004/0104427 A1 * | 6/2004 | Hao et al. | 257/330 |
| 2005/0242392 A1 * | 11/2005 | Pattanayak et al. | 257/328 |

* cited by examiner

*Primary Examiner*—Eugene Lee
*Assistant Examiner*—Mohammad T Karimy
(74) *Attorney, Agent, or Firm*—Dicke, Billig & Czaja, PLLC

(57) ABSTRACT

A trench transistor is described. In one aspect, the trench transistor has a cell array having a plurality of cell array trenches and a plurality of mesa zones arranged between the cell array trenches, and a semiconductor functional element formed in one of the mesa zones. A current flow guiding structure is provided in the mesa zone in which the semiconductor functional element is formed, said structure being formed at least partly below the semiconductor functional element and being configured such that vertically oriented current flows out of the semiconductor functional element or into the semiconductor functional element are made more difficult and horizontally oriented current flows through the semiconductor functional element are promoted.

16 Claims, 4 Drawing Sheets

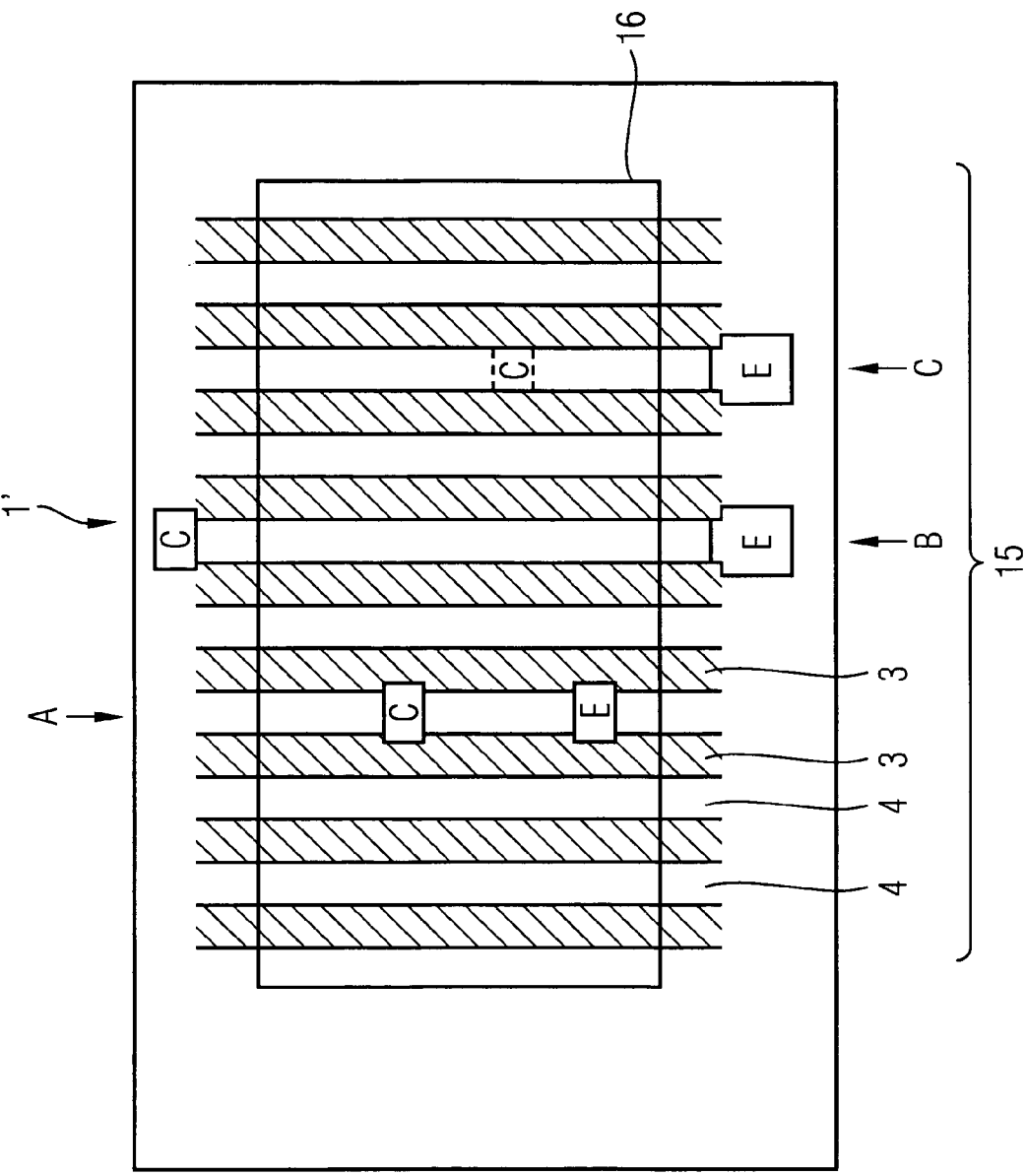

POWER SEMICONDUCTOR WITH FUNCTIONAL ELEMENT GUIDE STRUCTURE

CROSS-REFERENCE TO RELATED APPLICATIONS

This Utility Patent Application claims priority to German Patent Application No. DE 10 2004 026 233.0, filed on May 28, 2004, which is incorporated herein by reference.

FIELD OF THE INVENTION

The invention relates to a trench transistor.

BACKGROUND

Power semiconductor devices are increasingly being provided with sensors, which for example measure the temperature or the current intensity at specific points within the devices. By evaluating the sensor data, it is possible to identify overloads of the devices early on and to initiate suitable measures for preventing irreversible damage.

SUMMARY

One embodiment of the present invention provides a semiconductor having a trench transistor. In one embodiment, the trench transistor includes a cell array having a plurality of cell array trenches and a plurality of mesa zones arranged between the cell array trenches, and a semiconductor functional element formed in one of the mesa zones, it being possible, in the operating state of the trench transistor to generate vertically oriented current flows that permeate the mesa zones and horizontally oriented current flows that permeate the semiconductor functional element.

A current flow guiding structure is provided in the mesa zone in which the semiconductor functional element is formed. The structure is formed at least partly below the semiconductor functional element and configured such that vertically oriented current flows out of the semiconductor functional element or into the semiconductor functional element are made more difficult and horizontally oriented current flows through the semiconductor functional element are promoted.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates second possible contact-connecting embodiments of semiconductor functional elements of the trench transistor according to the invention.

DETAILED DESCRIPTION

Figure 1:
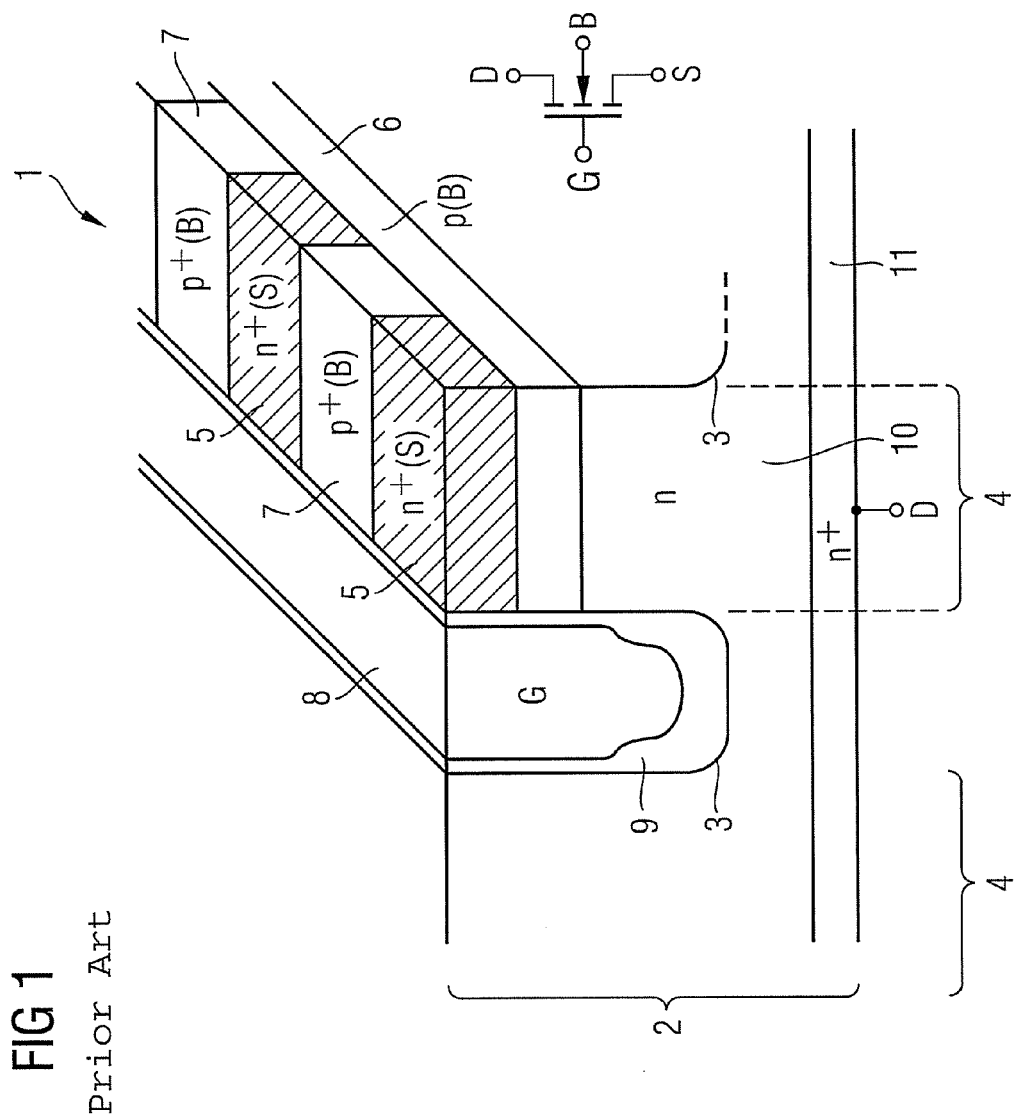
FIG. 1 illustrates a detail from a cell array of a conventional trench transistor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides a possibility that enables sensors to be integrated into a trench transistor as effectively as possible.

In one embodiment, a trench transistor according to the invention has a cell array, in which a plurality of cell array trenches and a plurality of mesa zones arranged between the cell array trenches are provided. Furthermore, the trench transistor has a semiconductor functional element serving as a sensor, which is formed in one of the mesa zones. The trench transistor is configured such that it is possible to generate, in the operating state of said trench transistor, vertically oriented current flows that permeate (at least some of the) mesa zones, and horizontally oriented current flows that permeate the semiconductor functional element. A current flow guiding structure is provided in the mesa zone in which the semiconductor functional element is formed, said structure being formed at least partly below the semiconductor functional element and being configured such that vertically oriented current flows out of the semiconductor functional element or into the semiconductor functional element are made more difficult and horizontally oriented current flows through the semiconductor functional element are promoted.

The current flow guiding structure makes it possible to suppress parasitic current flows between the semiconductor functional element and a drain terminal zone of the trench transistor. In this way, the horizontally oriented current flows that permeate the semiconductor functional element and that represent a measure of the parameter to be measured, for example the temperature, can be determined in an uncorrupted manner whereby the accuracy of the parameter measurement can be improved.

In one embodiment, the semiconductor functional element is a transistor, but may also be any other semiconductor functional element, for example a diode or a resistor.

In one embodiment, the semiconductor functional element is a MOS-transistor having a source zone of a first doping type, a body zone of a second doping type and a drain zone of the first doping type. The source zone and the drain zone are spaced apart horizontally from one another and connected to one another by the body zone. In this embodiment, at least one of the electrodes that are provided within the cell array trenches adjacent to the semiconductor functional element serves as a gate electrode in order to induce a channel in the body zone of the MOS transistor.

In a further embodiment, the semiconductor functional element is realized as a bipolar transistor having an emitter zone of a first doping type, a base zone of a second doping type and a collector zone of the first doping type. The emitter zone is horizontally spaced apart from the collector zone; furthermore, the emitter zone and the collector zone are connected to one another by the base zone.

The current flow guiding structure may be a highly doped semiconductor layer, by way of example. If the semiconductor functional element is formed as a transistor, the second doping type would have to be chosen as the doping type of the semiconductor layer. Furthermore, the semiconductor layer should directly adjoin the body zone/base zone. However, it is also possible to bury the semiconductor layer in a manner spaced apart from the body zone/base zone within the mesa zone.

The current flow guiding structure should preferably cover the entire cross-sectional area of the mesa zone below the semiconductor functional element in order to enable parasitic current flows to be suppressed as well as possible. However, the invention is not restricted thereto; by way of example, semiconductor layers with cutouts are also conceivable.

The semiconductor functional element may be arranged at an arbitrary location within the cell array. By way of example, it is possible to arrange the semiconductor functional element between two active cell array trenches. As an alternative thereto, it is possible to arrange the semiconductor functional element between deactivated cell array trenches at the edge of the cell array. The positioning of the semiconductor functional element within the trench transistor depends greatly on what parameter is intended to be measured. Thus, the semiconductor functional element would advantageously have to be positioned centrally in the cell array if the temperature of the cell array is intended to be measured as accurately as possible.

The semiconductor functional element may be completely enclosed with trenches. By way of example, the semiconductor functional element may be laterally delimited by the cell array trenches, the cell array trenches in front of and behind the semiconductor functional element being connected to one another by additional transverse trenches, thus giving rise to a closed trench ring around the semiconductor functional element.

The invention can particularly advantageously be applied to dense trench transistors, that is to say to trench transistors whose trenches are very close to one another (i.e., whose mesa zone widths are small). In one preferred embodiment, the semiconductor functional element serves as a temperature sensor for measuring the temperature of the cell array. Further application possibilities would be current intensity sensors, voltage sensors and the like.

In the figures, identical or mutually corresponding parts are identified by the same reference numerals. Furthermore, all embodiments can be doped inversely, that is to say that p- and n-doped zones can be interchanged with one another.

FIG. 1 illustrates a detail from a cell array of a trench transistor 1 in accordance with the prior art: a plurality of cell array trenches 3 are formed in a semiconductor body 2, a mesa zone 4 being arranged between two respective cell array trenches 3. A plurality of $n^+$-doped source zones 5 and a p-doped body zone 6 are provided in each mesa zone 4, the source zones 5 being separated from one another by $p^+$-doped zones 7 that are in each case connected to the body zone 6. An electrode 8 is provided in each of the cell array trenches 3, said electrode being isolated from the mesa zone 4 by an insulation layer 9. Situated beneath the body zone 6 is an n-doped drift zone 10, below which in turn an $n^+$-doped drain terminal zone 11 is situated. Situated above the cell array trenches 3 and also the mesa zones 4 is a source metallization layer (not shown), and situated beneath the drain terminal zone 11 is a drain metallization layer (not shown).

In the operating state of the trench transistor 1, channels can be produced in the body zone 6 by means of the electrodes 8, so that vertically oriented current flows are effected between the source zones 5 and the drain terminal zone 11.

Figure 2:
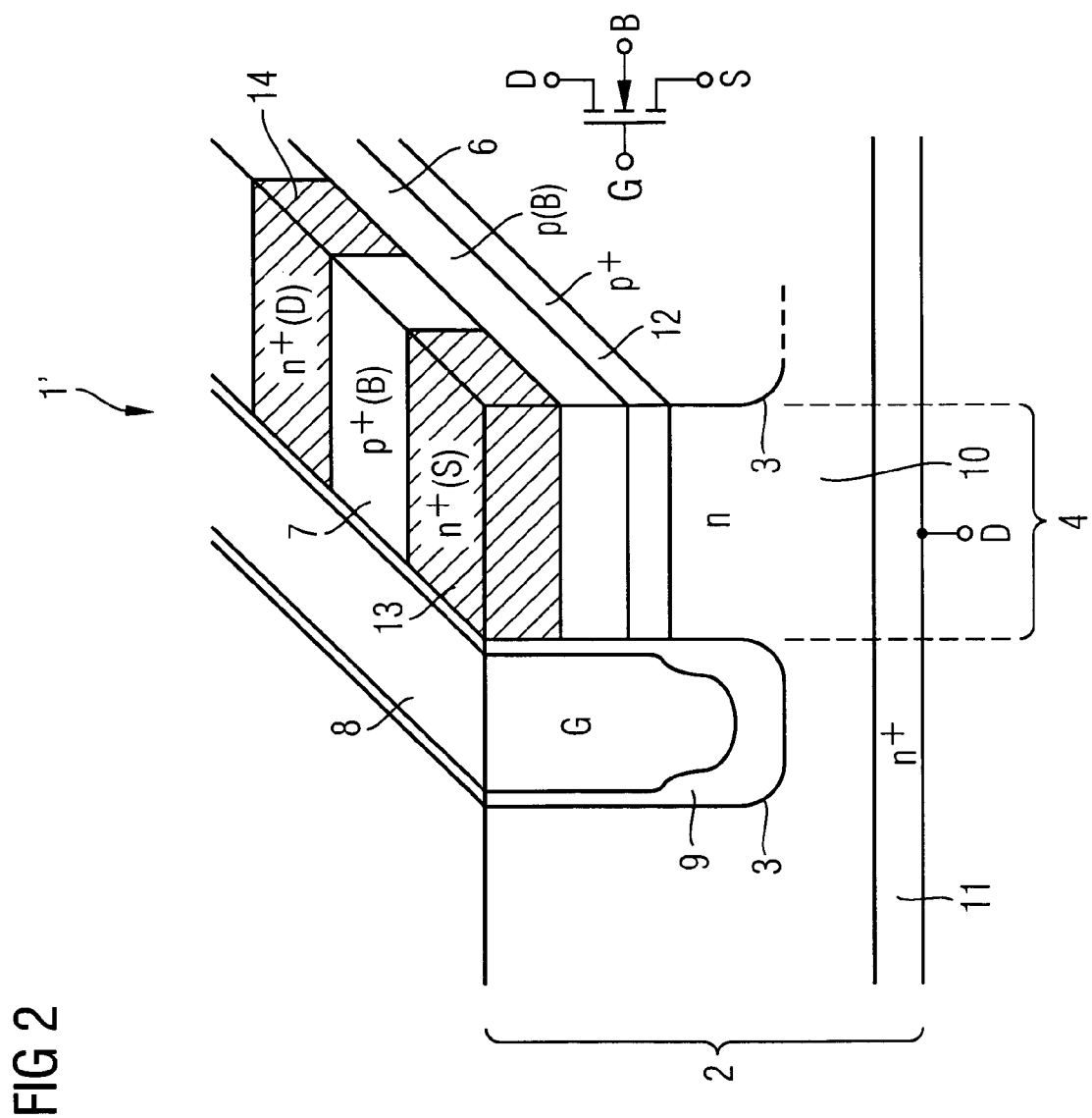
FIG. 2 illustrates a detail from a cell array of a one embodiment of a trench transistor according to the invention.

It is an aim of the invention, as already mentioned, to integrate into the structure illustrated in FIG. 1, with the least possible outlay, semiconductor functional elements that are permeated by horizontally oriented current flows. FIG. 2 illustrates a trench transistor 1' that fulfils these stipulations. The essential difference from the construction illustrated in FIG. 1 is that a current flow guiding structure 12 is provided beneath the body zone 6, said structure, in this embodiment, being a $p^+$-doped layer covering the entire cross-sectional area of the mesa zone 4. Furthermore, the source zones, identified by reference numeral 5 in FIG. 1, have a different function here. Thus, the first source zone functions as an emitter 13, and the second source zone functions as a collector 14. The emitter 13 and also the collector 14 are contact-connected via terminals (not shown) and, together with the body zone 6 and the $p^+$-doped zone 7, form a transistor in which it is possible to generate a horizontally oriented current flow (the current flow runs from the emitter 13 into the body zone 6 and from the body zone 6 into the collector 14). In this case, the horizontally oriented current flow serves as a measurement current in order to detect the temperature within the mesa zone 4 (the resistance which the horizontally oriented current flow has to overcome is dependent on the temperature in the mesa zone 4).

The current flow guiding device 12 prevents parasitic current flows from occurring between the emitter 13 and the drain terminal zone 11 or significantly attenuates this effect. The emitter 13 and also the collector 14 can be made very wide, that is to say cover a large cross-sectional area of the mesa zone 4. It is likewise possible to configure the $p^+$-type zone such that the latter covers a large cross-sectional area of the mesa zone 4. In this way, the length of the path which has to be overcome by the horizontally oriented current flow through the semiconductor functional element can be set individually.

If the lateral semiconductor functional element illustrated in FIG. 2 is configured as a MOS-transistor, in the on state a channel is induced in the body zone 6 by means of the electrode 8 in the adjoining cell array trench 3. In this case, there is no need to provide a dedicated terminal for the $p^+$-doped zone 7 that contact-connects the body zone 6. However, if the semiconductor functional element is configured as a bipolar transistor, then the $p^+$-doped zone 7 requires a dedicated terminal (base terminal) that replaces the function of the semiconductor functional element.

Figure 3:
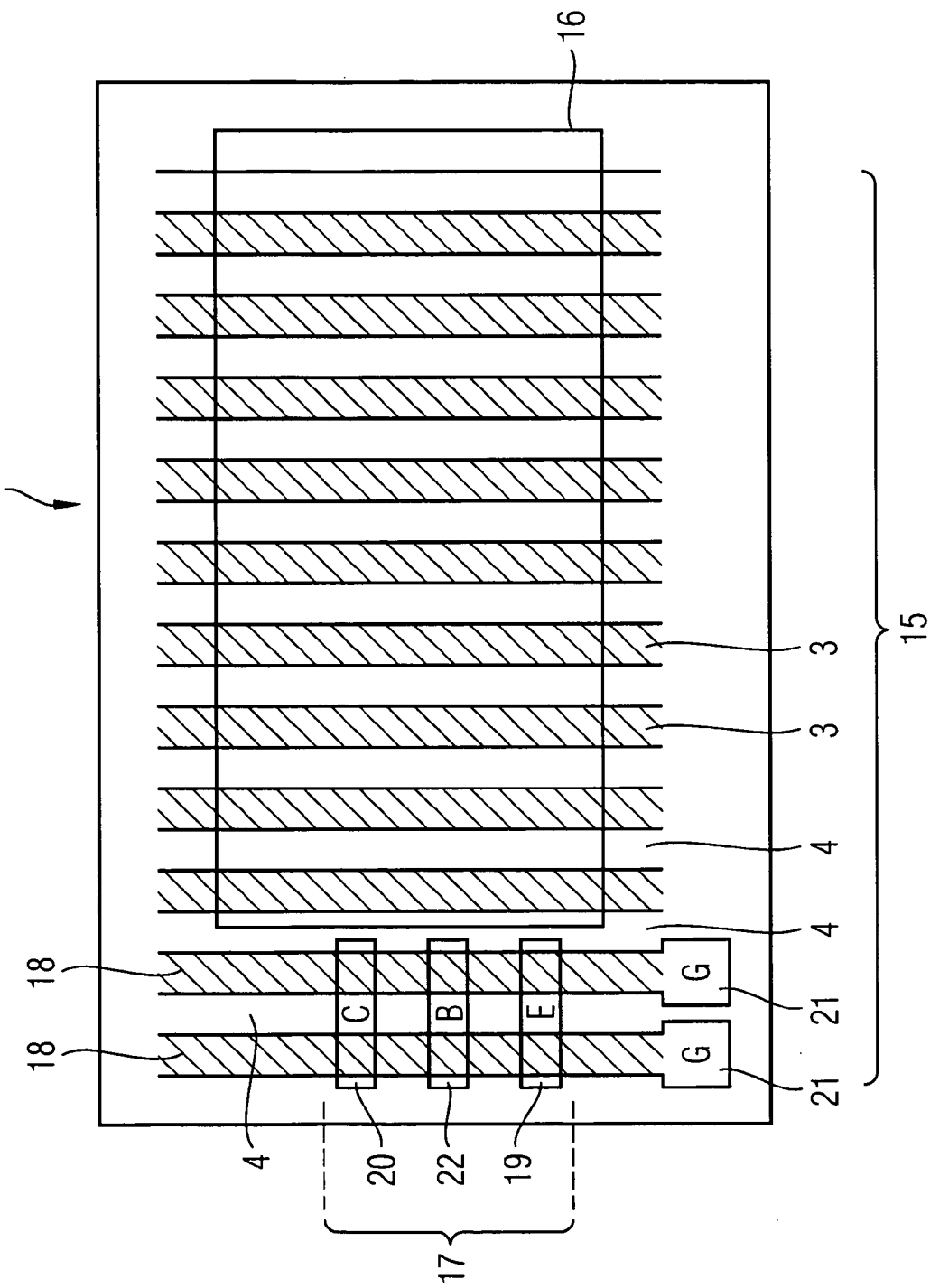
FIG. 3 illustrates first possible contact-connecting embodiments of semiconductor functional elements of a trench transistor according to the invention.

FIG. 3 illustrates a plan view of a possible embodiment of the trench transistor according to the invention. The illustration illustrates a cell array 15, in which a plurality of cell array trenches 3 and mesa zones 4 are provided. The active cell array trenches are covered with a source metallization layer 16, a semiconductor functional element (a transistor) 17 being formed between two deactivated cell array trenches 18 at the edge of the cell array 15. In the case of a MOS-transistor, the semiconductor functional element 17 can be contact-connected by the contacts 19 (emitter) and 20 (collector); the electrodes 8 of the deactivated cell array trenches 18 are furthermore contact-connected via contacts 21. In the case of a bipolar transistor, the contacts 21 may be obviated, but a contact 22 for contact-connecting the base zone of the bipolar transistor is additionally required. The construction illustrated in FIG. 3 has the advantage that the semiconductor functional element can be integrated into the trench transistor in a manner that is relatively free of problems. What may be disadvantageous about this, however, is that when the semiconductor functional element is used as a temperature sensor, there is a relatively large distance between the latter and the active cell array trenches 3 in the vicinity of which the heat to be measured is generated. It is thus possible for errors to occur in the temperature measurement.

Such disadvantages can be avoided with arrangements that are illustrated in FIG. 4. FIG. 4 illustrates three different contact-connecting possibilities for MOS-transistor semiconductor functional elements (gate terminals for the MOS-transistor not shown). In a first embodiment, both the emitter contact and the collector contact are contact-connected by terminals that are routed through the source metallization layer 16 upward from the trench transistor 1' (Case a). In a second embodiment (Case b), the emitter and collector terminals are respectively situated outside the source metallization layer 16. In a third embodiment (Case c), the emitter terminal is situated outside the source metallization layer 16, but the collector terminal is connected to the source metallization layer 16. In the case of a bipolar transistor, a base contact must in each case be provided (not shown) between the emitter contact and the collector contact.

It has become clear from the preceding description that trench transistors can be provided with additional functions in a simple manner with the aid of an n-channel MOS-transistor. The invention can be applied in particular to trench transistors with a small trench spacing, i.e., with a small mesa zone width, since, in these transistors, the breakdowns occur predominantly in the region of the trench bottoms and the provision of the current flow guiding structure (in particular in the case of a highly doped semiconductor layer) thus has hardly any influence on the breakdown voltage. The situation is different in the case of trench transistors whose mesa zone widths are larger than the trench widths, since in this case the breakdown occurs predominantly at a junction between the body zone and the drift zone arranged underneath. An increase in the doping concentration in this region would reduce the breakdown voltage.

The vertical position of the current flow guiding structure is preferably provided at the level of the lower part of the gate oxide (of the thinned part of the insulation layer), but may also be provided at the level of the upper region of the thick oxide (of the thickened part of the insulation layer) or in a region that simultaneously encompasses both of the aforementioned regions.

In order to integrate the current flow guiding structure into the mesa zone of the trench transistor, the standard process for fabricating the trench transistor has to be extended only to an insignificant degree. As a rule, an additional shading mask should be sufficient to fabricate this structure, so that, on the one hand, the vertical MOS cells and, on the other hand, the lateral MOS cell (semiconductor functional element) are configured optimally with regard to the body/base zone, whereby the properties of both types of transistor are optimized.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor comprising:
   a cell array having a plurality of cell array trenches formed in a vertical direction within a semiconductor body having a first conductivity type, the cell array trenches having a longitudinal extension in a first horizontal direction and a width in a second horizontal direction of the semiconductor body;
   a plurality of mesa zones arranged between the cell array trenches, each of the mesa zones running in the first horizontal direction and comprising a plurality of source zones of the first conductivity type which are separated from one another by highly doped separating zones of a second conductivity type, wherein a width of each of the source zones and separating zones in the second horizontal direction is equal to the width of the mesa zones, and each of the source zones and separating zones are respectively sequentially alternating in the first horizontal direction and are connected to a body zone having the second conductivity type and extending in the first horizontal direction beneath the source zones and the separating zones;
   a semiconductor sensor element formed in the first horizontal direction in one of the mesa zones and comprising two of the source zones separated by one of the separating zones; and
   a current flow guide structure formed in the one mesa zone and comprising a semiconductor layer extending in the first horizontal direction beneath the body zone and at least partly below the semiconductor sensor element and configured with a higher doping concentration of the second conductivity type relative to the body zone, wherein
   at least the two source zones of the semiconductor sensor element are respectively separately contact connected via terminals and together with the body zone form a transistor which enables a current to flow in the first horizontal direction through the semiconductor sensor element, and wherein the current flow guide structure is configured to attenuate a vertically oriented current flow between a source zone of the semiconductor sensor element and a drain terminal zone formed in the semiconductor body vertically opposite to the source zone.

2. The semiconductor of claim 1, wherein the semiconductor sensor element comprises a MOS-transistor.

3. The semiconductor of claim 2, wherein an electrode provided within a cell array trench adjacent to the semiconductor sensor element serves as a gate electrode to induce a channel in the body zone of the MOS-transistor.

4. The semiconductor of claim 1, wherein the semiconductor sensor element comprises a temperature sensor, and
   the current flows through the semiconductor sensor element in the first horizontal direction are representative of a temperature of the semiconductor.

5. A power trench transistor comprising:
   a cell array having:
     a plurality of cell array trenches formed in a vertical direction within a semiconductor body having first conductivity type, the cell array trenches having a longitudinal extension in a first horizontal direction of the semiconductor body; and
     a plurality of mesa zones arranged between the cell array trenches, each of the mesa zones running in the first horizontal direction and comprising a plurality of source zones of the first conductivity type which are separated from one another by highly doped separating zones of a second conductivity type, wherein a width of each of the source zones and separating zones in the second horizontal direction is equal to the width of the mesa zones and each of the source zones are respectively sequentially alternating in the first horizontal direction and connected to a body zone having the second conductivity type and extending in the first horizontal direction beneath the alternating source zones and the separating zones;

a semiconductor sensor element formed in the first horizontal direction in one of the mesa zones and comprising two of the source zones separated by one of the separating zones; and a current flow guide structure formed in the one mesa zone and comprising a semiconductor layer extending longitudinally in the first horizontal direction beneath the body zone and at least partly below the semiconductor sensor element and having a higher doping concentration of the second conductivity type relative to the body zone, wherein at least the two source zones of the semiconductor sensor element respectively separately connected via terminal and, together with the body zone, form a transistor which enables a current to flow through the semiconductor sensor element in the first horizontal direction, and wherein the current flow guide structure is configured to attenuate a vertically oriented current flow between a source zone of the semiconductor sensor element and a drain terminal zone formed in the semiconductor body vertically opposite to the source zones.

6. The power trench transistor of claim 5, wherein the semiconductor sensor element comprises a MOS-transistor, and wherein the two source zones of the semiconductor sensor element being separated from one another by the separating zone in the first horizontal direction comprise source and drain zones of the MOS-transistor.

7. The power trench transistor of claim 6, wherein an electrode provided within a cell array trench of the power trench transistor adjacent to the semiconductor sensor element serves as a gate electrode in order to induce a channel in the body zone of the MOS-transistor.

8. The power trench transistor of claim 5, wherein the semiconductor sensor element comprises a bipolar transistor, wherein the two source zones of the semiconductor sensor element being separated from one another by the separating zone in the first horizontal direction comprise emitter and collector zones of the bipolar transistor.

9. The power trench transistor of claim 5, wherein the semiconductor sensor element is completely enclosed with trenches.

10. The power trench transistor of claim 5, wherein the semiconductor sensor element is arranged between deactivated cell array trenches at an edge of the cell array.

11. The power trench transistor of claim 5, wherein the semiconductor sensor element serves as a temperature sensor.

12. The power trench transistor of claim 5, wherein the power trench transistor comprises a dense trench transistor.

13. A semiconductor device comprising:
a plurality of trenches formed in a vertical direction within a semiconductor body having a first conductivity type and extending longitudinally in a first horizontal direction and having a width in a second horizontal direction;
a plurality of mesa zones formed between the trenches and comprising a plurality of source zones of the first conductivity extending in the first horizontal direction and separated from one another by highly doped separation zones of a second conductivity type; and wherein a width of each of the source zones and separating zones in the second horizontal direction is equal to the width of the mesa zones and each of the source zones and separating zones are respectively sequentially alternating in the first horizontal direction and are connected to a body zone of the second conductivity type diposed below the source and separating zones, and wherein two source zones in one of the mesa zones respectively separating contact connected via terminals to form, along with the corresponding body zone, a sensor transistor through which a current orientated in the first horizontal direction can flow.

14. The semiconductor device of claim 13, wherein the horizontally oriented current is representative of a temperature of the semiconductor.

15. The semiconductor device of claim 13, further including:
a current flow guide structure formed in the one mesa zone and comprising a highly doped semiconductor layer of the second conductivity type extending in the first horizontal direction beneath the body zone and at least partially below the sensor transistor and configured to attenuate a vertically oriented current flow between a source zone of the sensor transistor and a drain terminal formed within the semiconductor body vertically opposite to the source zones.

16. A power semiconductor having a trench transistor comprising:
a cell array having a plurality of cell array trenches which have a longitudinal extension in a first horizontal direction and a width in a second horizontal direction and a depth in a vertical direction within a semiconductor body having a first conductivity type and a plurality of mesa zones arranged between the cell array trenches and each running in the first horizontal direction;
a semiconductor sensor element formed in the first horizontal direction in one of the mesa zones and comprising a MOS transistor having a source zone of the first conductivity type, a body zone of a second conductivity type, and a drain zone of the first conductivity type, the source and drain zone being separated from one another in the first horizontal direction by a separating zone of the second conductivity type and being connected to one another by the body zone, wherein a respective width of the source zone, separating zone, body zone and drain zone of the semiconductor sensor element in the second horizontal direction is equal to a width of the one mesa zone in the second horizontal direction;
a current flow guiding structure formed in the first horizontal direction in the one mesa zone and comprising a semiconductor layer of the second conductivity type, the doping concentration of which is higher than that of the body zone, the semiconductor layer provided beneath the source zone, drain zone, and body zones and formed at least partly under the MOS-transistor forming the semiconductor sensor element; and
an electrode provided within a cell array trench adjacent to the MOS-transistor forming the semiconductor sensor element to serve as a gate electrode to induce a channel in the body zone of the MOS transistor forming the semiconductor sensor element.

* * * * *